United States Patent [19]

Ueno et al.

[11] Patent Number: 4,637,851

[45] Date of Patent: Jan. 20, 1987

[54] METHOD FOR THE PREPARATION OF A LAMINATE

[75] Inventors: Susumu Ueno; Kouiti Kuroda, both of Ibaraki; Hirokazu Nomura, Tokyo; Shigeru Tateno, Ibaraki, all of Japan

[73] Assignee: Shin-Etsu Chemical Co., Ltd., Otemachi, Japan

[21] Appl. No.: 819,694

[22] Filed: Jan. 17, 1986

[30] Foreign Application Priority Data

Jan. 25, 1985 [JP] Japan .................................. 60-11885
Jan. 25, 1985 [JP] Japan .................................. 60-11886

[51] Int. Cl.[4] ........................ B32B 31/00; B29C 17/08

[52] U.S. Cl. .................................. 156/272.6; 156/629; 156/643; 156/646; 156/668; 427/40; 427/307

[58] Field of Search ..................... 156/222, 242, 272.2, 156/272.6, 288, 307.3, 307.4, 330, 629, 643, 646, 668; 204/192 E; 427/38, 39, 40, 41, 307

[56] References Cited

U.S. PATENT DOCUMENTS 4,410,586 10/1983 Ladizesky et al. .......... 156/272.6 X
4,504,349 3/1985 Ueno et al. ........................ 156/272.6
4,588,641 5/1986 Haque et al. ................. 156/272.6 X

*Primary Examiner*—William A. Powell
*Attorney, Agent, or Firm*—Hopgood, Calimafde, Kalil, Blaustein & Judlowe

[57] ABSTRACT

A method is proposed for the preparation of a laminate with improved mechanical strength such as the cloth-to-cloth adhesive bonding strength using a prepreg based on a fabric sheet of aromatic polyamide fibers and an adhesive preferably selected from polyimide-based and epoxy resin-based adhesives, in which the fabric sheet is pretreated by exposure to low-temperature plasma of preferably a gas mixture composed of oxygen and nitrogen under a reduced pressure of 0.5 to 20 Torr. The improvement is derived presumably from the increase in the wettability and affinity of the fibers to the adhesive as is suggested by the remarkable increase of adhesive pick-up.

7 Claims, No Drawings

METHOD FOR THE PREPARATION OF A LAMINATE

BACKGROUND OF THE INVENTION

The present invention relates to a method for the preparation of a laminate or, more particularly, to a method for the preparation of a laminate based on fabric sheets of aromatic polyamide fiber laminated by use of a resinous adhesive or binder.

The invention further relates to a method for the preparation of a laminate useful, for example, as a material for substrates of printed circuit boards having a greatly improved mechanical strength and dimensional stability by increasing the adhesive bonding strength between the resin-impregnated fabric sheets forming the laminate.

Aromatic polyamide fibers are excellent in several characteristics such as low density, high strength, high elastic resilience, high heat-resistance, high flame-retardancy and so on and are very useful as a base meterial of laminates of which heat resistance is essential. The fibers, however, have a problem relative to the poor adhesive bonding strength to a resinous binder used in the preparation of prepreg sheets to be laminated so that it is eagerly desired to improve the aromatic polyamide fibers in this regard.

In order to improve the adhesion of the aromatic polyamide fibers to an adhesive or resinous binder, various proposals and experimental attempts have been hitherto made on the methods of treatment including chemical treatments in several different ways such as chemical etching, priming and the like and physical treatments such as corona discharge treatment and so on. No satisfactory results, however, have yet been obtained due to the outstandingly high stability of the aromatic polyamide fibers per se as a chemical material.

SUMMARY OF THE INVENTION

The present invention has an object to provide a method for the preparation of a laminate characterized by the greatly improved mechanical strength and stability against the influence of ambience not obtained by the above mentioned prior art methods.

Thus, the method of the present invention for the preparation of a laminate based on fabric sheets of aromatic polyamide fibers comprises the steps of:

(a) subjecting the fabric sheet of the aromatic polyamide fibers to exposure to an atmosphere of low temperature plasma of a plasma-supporting gas under a gaseous pressure in the range from 0.05 to 20 Torr;

(b) impregnating the thus plasma-treated fabric sheet with a resinous binder selected from the group consisting of polyimide resins and epoxy resins to give a resin-impregnated prepreg;

(c) laying a plural number of the resin-impregnated prepreg one on the other into a pile; and (d) pressing the pile of the resin-impregnated prepregs at an elevated temperature so as to convert the prepregs into an integral laminate.

It is preferable that the plasma-supporting gas under the above mentioned gaseous pressure is preferably a gaseous mixture composed of oxygen and nitrogen in a volume ratio in the range from 95:5 to 5:95. It is further preferable that the flow rate of the gas supporting the plasma discharge through the atmosphere of low temperature plasma and the high-frequency input power for the plasma discharge satisfy such an interrelationship that the ratio of the flow rate of the gas as expressed in a unit of ml/minute at N.T.P. and the input power as expressed in watts is in the range from 1:5 to 1:500. In other words, the flow rate should preferably be in the range from 0.002 to 0.2 liter/minute at N.T.P. per kilowatt of the electric power impressed between the electrodes. The fabric sheets of the aromatic polyamide fibers treated after the low-temperature plasma treatment should preferably be treated with a coupling agent having an amino group or an epoxy group in the molecular structure.

The thus prepared laminate is impregnated with the adhesive or binder in a remarkably increased amount in comparison with the laminates prepared of the same fabric of the aromatic polyamide fibers without the low-temperature plasma treatment presumably due to the increase of wettability and affinity of the fibers to the adhesive consequently to give excellent properties such as the mechanical strength and the like.

DETAILED DESCRIPTION OF THE PREFERRED EMBODIMENTS

The novel method of the invention for the preparation of a laminate comprises the above mentioned steps using a fabric sheet of aromatic polyamide fibers and a resinous adhesive as the starting materials.

In the first step of the present invention, the fabric sheet of aromatic polyamide fibers is exposed to low-temperature plasma generated in an atmosphere of an inorganic gas under a pressure of 0.05 to 20 Torr. The method of the low-temperature plasma treatment is performed by holding the fabric sheet of the aromatic polyamide fibers in a plasma chamber of an apparatus for low-temperature plasma generation capable of being evacuated to the above mentioned reduced pressure and impressing a high frequency electric power at a frequency of, for example, 10 kHz to 100 MHz between the electrodes while keeping a gentle flow of the inorganic gas under a reduced pressure through the plasma chamber.

Internal electrode-type apparatuses, i.e. apparatuses provided with electrodes inside the plasma chamber, are preferred as the low-temperature plasma generator in practicing the method of the present invention. It is essential at any rate that the surface of the aromatic polyamide fibers is freed from the influence of the heat of electric discharge to avoid thermal degradation.

Although, as is mentioned above, the method of the present invention should preferably be carried out in a plasma chamber of internal electrode-type, the form of the electrodes is not particularly limitative. Namely, the form of the power input electrode and the grounded electrode, which may be of the same form or different forms from each other, can be selected from various types including plates, rings, rods, cylinders and the like. Furthermore, another convenient design of the plasma chamber is that the inner walls of the chamber are made of a metal to serve as a grounded electrode and one or more of input electrodes are installed inside the chamber. Various metals such as copper, iron, aluminum and the like are used generally as the material of the power input electrodes. They are preferably coated with an insulating material having a dielectric strength of at least 10,000 volts such as glass, porcelain enamel, ceramic and the like in order to ensure stability of the electric discharge. In particular, electrodes of a rod-like form with an insulating coating layer are used satisfactorily when localized generation of low temperature plasma is desired.

Generally, impression of an excessively large electric power between the electrodes is not preferable because of the increased risk of decomposition or deterioration of the fabric material caused by the heat of electric discharge so that it is essential to control the power within a certain range. In the cases of aromatic polyamide fibers, however, the electric power can be relatively large in comparison with other synthetic fibers in order to obtain more prominent effect of the plasma treatment by virtue of the excellent heat resistance thereof. Assuming that the distance between the surfaces of the grounded electrode and the input electrode is in the rnge from 10 to 500 mm, for example, the preferred electric power at a high frequency impressed between the electrodes is in the range from 3 to 100 kW/m$^2$ of the overall effective surface area of the input electrodes. Further, the input power should preferably be selected in consideration of the flow rate of the plasma-supporting gas through the atmosphere as is mentioned before.

The examples of the inorganic gases used in the present invention as the plasma-supporting gas include helium, neon, argon, nitrogen, nitrous oxide, nitrogen dioxide, oxygen, air, carbon monoxide, carbon dioxide, hydrogen and chlorine, and, furthermore, even hydrogen chloride, sulfur dioxide, hydrogen sulfide and the like may also be used. They are used either alone or as a mixture of two kinds or more according to need. Among them, however, oxygen and nitrogen are particularly effective and furthermore a gaseous mixture composed of oxygen and nitrogen is particularly effective to improve the adhesion between the aromatic polyamide fibers and the resinous adhesive or binder.

The mixing ratio of oxygen and nitrogen in this case should preferably be in such a proportion that the volume ratio of oxygen to nitrogen is in the range from 95:5 to 5:95 or, more preferably, in the range from 10:90 to 60:40. The gaseous pressure inside the plasma chamber should be preferably in the range from 0.05 to 20 Torr or, more preferably, in the range from 0.1 to 10 Torr. A pressure lower than 0.05 Torr can produce less effect of improvement in the adhesive bonding between the fabric and the binder while stability of the electric discharge can hardly be maintained consequently with less effect of improvement in the adhesive bonding when the pressure is higher than 20 Torr.

The aromatic polyamide fibers to be subjected to the plasma treatment may be in the form of cords followed by subsequent weaving into a fabric sheet. A preferred form of the fibers in the invention, however, is one of the generally available non-woven and woven cloths including plain-woven cloths, satin cloths, twill cloths and the like. It is of course optional that other kinds of fibers such as carbon fibers, glass fibers and the like are used in combination with the aromatic polyamide fibers in the cloths. The fabric material of the aromatic polyamide fibers thus treated with low-temperature plasma is then transferred to the second step of impregnation with a resinous adhesive or binder. It is optional or rather preferable that the impregnation with the resinous binder is preceded by a pretreatment with a coupling agent having an amino group or an epoxy group in the molecular structure to obtain a more stable and more excellent effect of improving the adhesive bonding strength. The coupling agent suitable in this case is an organosilane com-pound exemplified by 3-aminopropyl triethoxysilane, 3-ethylenediaminopropyl trimethoxysilane, 3-glycidyloxypropyl trimethoxysilane, 3-glycidyloxypropyl methyl dimethoxysilane and the like. The plasma-treated fabric material of aromatic polyamide fibers is soaked with an aqueous or organic solution of the coupling agent in a concentration of a few % or lower followed by complete drying either by heating at a temperature in the range from 100° to 150° C. or by storing for a length of time under good ventilation. The thus obtained sheet-like material by the impregnation of the fabric material with the resinous binder is called a prepreg of which a laminate is molded.

The adhesive or binder used in the preparation of the prepreg is specific and critically selected in consideration of the heat resistance and adhesiveness in order to ensure the durability of the laminate products. Polyimide-based and epoxy resin-based adhesives are the preferred examples in the inventive method. The adhesives of the former class are known by their outstanding heat resistance though with a disadvantage of their relatively poor adhesive bonding strength to the aromatic polyamide fibers and the adhesives of the latter class are known by their excellent adhesiveness.

A generally preferred form of the polyimide-based adhesive is a polyimide resin oligomer in an organic solution. A typical example of the polyimide-based adhesives is a polyamino-bismaleimide which is a reaction product of (A) 4,4'-diamino diphenyl methane and (B) 4,4'-bis(maleimido) diphenyl methane as the starting reactants. One of the typical grades of the commercial products of polyimide-based adhesives available on the market is Kelimide 601.

The polyimide-based adhesive belonging to the first class of the ahesives is used usually as diluted to have a solid content of about 40 to 70% by weight with an organic solvents selected from N-methyl pyrrolidone, ethyleneglycol monomethyl ether monoacetate, dimethyl formamide and the like. The solution is applied to the fabric material of the aromatic polyamide fibers by dipping or roll-coating and the fabric material is then subjected to preliminary drying to give a tack-free adhesive-impregnated prepreg based on the fabric material of the aromatic polyamide fibers.

Typical examples of the epoxy resin-based adhesives belonging to the second class used in the method of the invention include bisphenol A-based epoxy resins prepared by the condensation reaction of bisphenol A and epichlorohydrin, brominated bisphenol A-based epoxy resins imparted with flame retardancy and polyepoxy-functional novolak-type phenol-formaldehyde resins. In addition, another group of low-molecular polyepoxy compounds useful in the invention includes 1,3-bis(N,N'-diglycidyl aminomethyl)cyclohexane, N,N,N',N'-tetraglycidyl 1,3-xylylenediamine, triglycidyl cyanurate and polyepoxy-functional ethers such as diglycidyl phenylglycidyl ether and the like which in a wide sense can be regarded as a kind of eopxy resins.

These epoxy resins are used in combination with a known curing catalyst including amines such as diethylene triamine, triethylene tetramine, 1,3-xylylene diamine and the like, acid anhydrides such as phthalic anhydride, tetrahydrophthalic anhydride and the like, salts of tertiary amines, imidazole compounds, polyamide resins, boron trifluoride complexes and so on. Careful selection of the kind and adjust-ment of the mixing ratio is required for these curing catalysts as is mentioned afterward in order to avoid premature gelation of the epoxy resin in the course of drying of the solvent and to keep appropriate gelation rate in the subsequent step of compression molding into a laminate.

The solution of the epoxy resin-based adhesive used in the impregnation of the plasma-treated fabric material is prepared by dissolving the epoxy-based resin and the curing catalyst either separately or as a mixture in an organic solvent such as methyl ethyl ketone, dimethyl formamide, ethyleneglycol monomethyl ether and the like in a concentration of about 40 to 70% by weight.

The amount of the adhesive or binder with which the plasma-treated fabric material of the aromatic polyamide fibers is impregnated is usually in the range from 50 to 250% or, preferably, from 80 to 200% by weight when the impregnating adhesive is a polyimide-based adhesive and in the range from 40 to 150% or, preferably, from 60 to 120% by weight when the adhesive is an epoxy resin-based adhesive based on the plasma-treated fabric material so as to obtain a laminated product extremely excellent in the adhesive bonding strength between layers. The adhesive bonding strength between layers decreases when the amount of the adhesive impregnating the fabric material is smaller than the above mentioned lower limits for the respective classes of the adhesives.

Presumably, the increase of wettability and affinity of the aromatic polyamide fibers after the low-temperature plasma treatment to the adhesive may be the reason for the relatively large amount of the adhesive required for fully impregnating the fabric material up to 50% or, in particular, 80% by weight for the polyimide-based adhesives and up to 40% or, in particular, 60% by weight for the epoxy resin-based adhesives based on the fabric material as a result of the increased infiltration of the adhesive into the fibrous structure to cause deficiency in the adhesive capable of contributing to the interlaminar bonding or adhesion of the fabric sheets when the amount of the adhesive is limited approximately to a conventional amount.

The prepregs obtained by the impregnation with the adhesive in a manner described above are then subjected to drying to remove the solvent and other volatile materials. The procedure of drying should be carried out to such an extent that the dried prepreg is completely tack-free but the adhesive impregnating the prepreg is in a semi-cured state still retaining flowability under pressure at an elevated temperature at least at the beginning stage of the subsequent compression molding.

The drying procedure is carried out usually at a temperature of 110° to 160° C. for 5 to 30 minutes but modification of the conditions is of course optional depending on the curing behavior of the adhesive resin and the kind of the solvent used as the diluent of the resin.

The prepregs thus prepared are then transferred to the procedure of compression molding or pressure lamination. Thus, a plural number of the prepreg sheets are layed one on the other into a pile which is then pressed at an elevated temperature so as to be integrated into a laminate. The conditions of pressure lamination are selected so as to facilitate uniform distribution of the adhesive resin throughout the laminate as a result of the concurrent flow of the molten resin and curing of the same under pressure. The particular conditions for the pressure lamination include 10 to 50 kg/cm$^2$ of the pressure, 180° to 230° C. of the temperature for a polyimide-based adhesive or 160° to 200° C. of the temperature for an epoxy resin-based adhesive following to the preheating under a pressure up to 50 kg/cm$^2$ at 130° to 180° C. for the polyimide-based adhesive or 130° to 160° C. for the epoxy resin-based adhesive. In order to secure full curing of the adhesive, the pile of the prepreg sheets should be pressed down continuedly for 30 minutes to 30 hours at the curing temperature.

The laminate prepared by the compression molding is then sent to the step of post-cure to finish the preparation according to the inventive method in order to ensure complete curing of the adhesive resin and to remove any unnecessary volatile components. The condition of the post-cure should be set up preferably in such a manner that the temperature compression molding and the temperature about 30° C. higher than that and the time for the post-cure should be from 1 to 20 hours for the polyimide-based adhesives and 1 to 10 hours for the epoxy resin-based adhesives. As a matter of course, it is possible to omit the step of post-cure by sufficiently extending the time taken in the compression molding.

The laminate obtained by the method of the present invention is excellent in the heat-conductivity, heat-resistance and dimensional stability and, furthermore, by virtue of the improved adhesive bonding strength between layers of the fabric sheets of the aromatic polyamide fibers, it is also excellent in the mechanical characteristics such as flexural strength, flexural modulus and the like. Therefore, the laminate products prepared by the inventive method are useful as a structural material of which high heat-resistance and dimensional stability are essential. In particular, the laminate can be provided with a cladding of a copper foil and used as a material suitable for the substrate of printed circuit boards fully satisfying the requirements in the technology of electronics.

Details of the inventive method are further illustrated by way of examples in the following.

EXAMPLE 1

(Experiments No. 1 and No. 2).

A woven cloth of aromatic polyamide fibers available on the market was set in a plasma chamber of a low-temperature plasma generating apparatus and the chamber was evacuated to have a pressure of 0.01 Torr. A gaseous mixture composed of oxygen and nitrogen in a mixing ratio of 1:3 by volume was introduced into the thus evacuated chamber at a rate of 4.0 liters/minute and an electric power of 25 kilowatts at a frequency of 110 kHz was impressed for 1 minute between the grounded electrode and the input electrodes having an overall effective surface area of 0.6 m$^2$ and located at a distance of 10 cm from the surface of the grounded electrode while keeping the pressure at 0.3 Torr throughout so that the cloth on the electrode was exposed to the low temperature plasma generated in the plasma chamber.

The thus plasma-treated cloth was soaked with a 50% solution of a polyimide resin (Kelimide 601, supra) in N-methyl pyrrolidone and heated at 150° C. for 15 minutes to prepare a resin-impregnated prepreg of which the resin pickup was 100 %.

Then, ten sheets of the prepreg were laid one on the other into a pile and subjected to compression molding for 1 hour at 200° C. under a pressure of 25 kg/cm$^2$ with copper foils covering both sides of the sheet pile to give a laminate. The molded product was taken out of the press after cooling followed by a post-cure treatment for 3 hours at 200° C. and the cloth-to-cloth interlaminar bonding strength was tested (Experiment No. 1) to give a value of 1.1 kg/cm. Concurrently the test for the interlaminar bonding strength was undertaken of another laminate prepared by molding in a similar manner to the above with omission of the plasma-treatment of the cloth (Experiment No. 2). The result of the determination of the interlaminar bonding strength was only 0.5 kg/cm.

The method for the determination of the interlaminar bonding strength was as follows. Thus, test pieces each with dimensions of 1 cm wide and 12 cm long were taken by cutting the laminate at the center portion thereof and the cloth-to-cloth peeling strength was measured by 180° C. backward pulling of the lifted-up layer at a pulling velocity of 5 mm/minute.

EXAMPLE 2

(Experiments No. 3 and No. 4).

Experiments were carried out in about the same manner as in Example 1 excepting some alterations in the experimental conditions including the type of the adhesive and the conditions in the preparation of the prepreg. Thus, an epoxy resin-based adhesive of a formulation described below was used instead of the polyimide-based adhesive used in Example 1 and the resin-impregnated cloth was heated for 5 minutes at 150° C. for the preparation of a prepreg by evaporating the solvent.

Formulation of the impregnating resin solution, parts by weight

| | |
|---|---|
| Epikote 1045-B-80 (a product by Shell Chemical Co.) | 130 |
| DICY (a product by Toyo Ink Manufacturing Co.) | 5 |
| Imidazole 2E-4MZ (a product by Shikoku Kasei Co.) | 0.3 |
| Methyl ethyl ketone | 27 |
| Ethylene glycol monomethyl ether | 45 |
| Dimethyl formamide | 23 |

The pick-up amount of the epoxy resin adhesive in the resin-impregnated prepregs was 85% by weight. The compression molding of the prepreg sheets prepared using either the plasma-treated cloth or a cloth before the plasma treatment was carried out under a pressure of 30 kg/cm$^2$ at 180° C. for 1 hour followed by a post-cure treatment also at 180° C. for 1 hour.

The results obtained in the measurements of the interlaminar bonding strength in the laminates prepared of the plasma-treated cloth (Experiment No. 3) and the untreated cloth (Experiment No. 4) were 1.4 kg/cm and 0.9 kg/cm, respectively.

EXAMPLE 3

(Experiment No. 5).

The same cloth of aromatic polyamide fibers as used in Examples 1 and 2 was set in a plasma chamber of a low-temperature plasma generating apparatus and the chamber was evacuated to have a pressure of 0.01 Torr. Oxygen gas was introduced into the thus evacuated chamber at a rate of 3 liters/minute and a high frequency electric power of 25 kilowatts at a frequency of 110 kHz was impressed for 1 minute between the grounded electrode and the input electrodes having an overall effective surface area of 0.6 m$^2$ and located at a distance of 10 cm from the surface of the grounded electrode to generate low temperature plasma, to which the cloth on the electrode was exposed, while the pressure inside the chamber was adjusted and controlled at 0.25 Torr throughout. The thus plasma-treated cloth was processed into a prepreg with the same polyimide-based adhesive and conditions as in Example 1 and the prepreg sheets were compression-molded into a laminate also in the same manner as in Example 1. The result obtained in the determination of the interlaminar bonding strength was 0.9 kg/cm.

EXAMPLE 4

(Experiment No. 6).

The experimental conditions for the preparation of a laminate using a plasma-treated cloth of aromatic polyamide fibers were substantially the same as in Example 2 except that the plasma-supporting gas was pure oxygen at a pressure of 0.3 Torr. The value of the interlaminar bonding strength determined of this laminate was 1.1 kg/cm.

EXAMPLE 5

(Experiments No. 7 and No. 8).

The same cloth of aromatic polyamide fibers as used in the preceding examples was set in a plasma chember of a lowtemperature plasma generating apparatus and the chamber was evacuated to have a pressure of 0.01 Torr. A gaseous mixture composed of oxygen and nitrogen in a mixing ratio of 4:1 by volume was introduced into the thus evacuated chamber at a rate of 5 liters/minute and a high frequency electric power of 30 kilowatts at a frequency of 110 kHz was impressed for 30 seconds between the grounded electrode and the input electrodes having an overall effective surface area of 1.0 m$^2$ and located at a distance of 5 cm from the surface of the grounded electrode to generate low temperature plasma inside the chamber to which the cloth on the electrode was exposed while the pressure inside the chamber was adjusted and controlled at 0.5 Torr throughout. The thus plasma-treated aromatic cloth of aromatic polyamide fibers was then soaked with a 50 % by weight solution of the same polyimide resin as used in Example 1 in a 3:1 by weight mixture of N-methyl pyrrolidone and dimethyl formamide followed by heat-drying for 30 minutes at 130° C. to prepare a resin-impregnated prepreg. The amount of pick-up of the resin was 130% by weight.

Then, ten sheets of the prepreg were laid one on the other in a pile and the piled sheets were subjected to compression molding into a laminate for 90 minutes at 200° C. under a pressure of 20 kg/cm$^2$ with copper foils covering both sides of the sheet pile. The molded product was taken out of the press after cooling followed by a post-cure treatment at 200° C. for 2 hours. Determination was undertaken of the interlaminar bonding strength in the laminate in a similar manner to the preceding examples (Experiment No. 7) to give a value of 1.2 kg/cm. Concurrently, another laminate was prepared in the same manner as above excepting the omission of the plasma treatment of the cloth (Experiment No. 8) and the interlaminar bonding strength was determined thereof to give a value of 0.5 kg/cm.

EXAMPLE 6

(Experiments No. 9 and No. 10).

The same plasma-treated cloth of aromatic polyamide fibers prepared in Experiment No. 7 was soaked with an epoxy resin-based adhesive solution in a formulation described below followed by heating for 5 minutes at 140° C. to give a prepreg by evaporating the solvents. The amount of resin pick-up in the prepreg was 80% by weight.

Formulation of the impregnating resin solution, parts by weight

| | |
|---|---|
| Epikote 1045-B-80 (a product by Shell Chemical Co.) | 130 |
| Epikote 154 (a product by Shell Chemical Co.) | 20 |
| DICY (a product by Toyo Ink Manufacturing Co.) | 5 |
| Imidazole 2E-4MZ (a product by Shikoku Chemical Co.) | 0.2 |
| Methyl ethyl ketone | 40 |
| Ethylene glycol monomethyl ether | 40 |
| Dimethyl formamide | 30 |

Then, ten sheets of the prepreg were laid one on the other in a pile and the piled sheets were subjected to compression molding into a laminate for 1 hour at 160° C. under a pressure of 30 kg/cm$^2$ with copper foils covering both sides of the sheet pile. The molded product was taken out of the press after cooling followed by a post-cure treatment for 1 hour at 180° C. Determination of the cloth-to-cloth interlaminar bonding strength was undertaken of the thus prepared laminate (Experiment No. 9) to give a value of 1.3 kg/cm. Concurrently another laminate was prepared in just the same manner as above excepting the omission of the plasma treatment of the cloth of aromatic polyamide fibers. Determination of the interlaminar bonding strength in this laminate gave a value of 0.8 kg/cm (Experiment No. 10).

What is claimed is:

1. A method for the preparation of a laminate based on fabric sheets of aromatic polyamide fibers which comprises the steps of:
   (a) subjecting the fabric sheet of the aromatic polyamide fibers to exposure to an atmosphere of low temperature plasma under continuous introduction of a plasma-supporting gas into the atmosphere under a gaseous pressure in the range from 0.05 to 20 Torr generated by impressing a high-frequency electric power between a grounded electrode and an input electrode;
   (b) impregnating the thus plasma-treated fabric sheet with a resinous binder selected from the group consisting of polyimide resins and epoxy resins to give a resin-impregnated prepreg sheet;
   (c) laying a plural number of the resin-impregnated prepreg sheets one on the other into a pile; and
   (d) pressing the pile of the resin-impregnated prepregs at an elevated temperature so as to convert the prepregs into an integral laminate.

2. The method as claimed in claim 1 wherein the resinous binder is a polyimide resin and the resin pick-up in the prepreg is in the range from 50 to 250 parts by weight per 100 parts by weight of the fabric sheet of the aromatic polyamide fibers.

3. The method as claimed in claim 1 wherein the resinous binder is an epoxy resin and the resin pick-up in the prepreg is in the range from 40 to 150 parts by weight per 100 parts by weight of the fabric sheet of the aromatic polyamide fibers.

4. The method as claimed in claim 1 wherein the plasma-supporting gas is a gaseous mixture of nitrogen and oxygen.

5. The method as claimed in claim 4 wherein the mixing ratio of nitrogen and oxygen in the gaseous mixture of nitrogen and oxygen is in the range from 5:95 to 95:5 by volume.

6. The method as claimed in claim 1 wherein the distance between the surfaces of the grounded electrode and the input electrode is in the range from 30 to 500 mm and the high-frequency electric power impressed therebetween is in the range from 3 to 100 kilowatts per square meter of the surface area of the input electrode.

7. The method as claimed in claim 1 wherein the rate of introduction of the plasma-supporting gas is in the range from 0.002 to 0.2 liter/minute at N.T.P. per kilowatt of the electric power impressed between the electrodes.

* * * * *